United States Patent
Chien et al.

(10) Patent No.: US 10,965,284 B1
(45) Date of Patent: Mar. 30, 2021

(54) VOLTAGE MODE SIGNAL TRANSCEIVING DEVICE AND VOLTAGE MODE SIGNAL TRANSMITTER THEREOF

(71) Applicants: Global Unichip Corporation, Hsinchu (TW); Taiwan Semiconductor Manufacturing Co., Ltd., Hsinchu (TW)

(72) Inventors: Ting-Hsu Chien, Hsinchu (TW); Yen-Chung T. Chen, Santa Clara, CA (US); Wen-Lung Tu, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/861,223

(22) Filed: Apr. 29, 2020

(30) Foreign Application Priority Data

Feb. 11, 2020 (TW) ................................. 109104139

(51) Int. Cl.
- *H03K 3/00* (2006.01)
- *H03K 5/24* (2006.01)
- *H03K 17/00* (2006.01)
- *G01R 1/067* (2006.01)
- *H03K 17/687* (2006.01)

(52) U.S. Cl.
CPC ............................... *H03K 17/6871* (2013.01)

(58) Field of Classification Search
None
See application file for complete search history.

(56) References Cited

U.S. PATENT DOCUMENTS

| | | | | |
|---|---|---|---|---|
| 5,172,051 A * | 12/1992 | Zamborelli | ........ | G01R 1/06772 324/149 |
| 5,512,838 A * | 4/1996 | Roach | ................. | G01R 1/06711 324/149 |
| 6,661,276 B1 * | 12/2003 | Chang | ............... | H03K 17/04123 327/427 |
| 7,256,575 B2 * | 8/2007 | Pollock | .............. | G01R 1/06766 324/126 |
| 7,957,412 B2 * | 6/2011 | Steinberger | ......... | H04L 25/0262 370/463 |
| 8,564,308 B2 * | 10/2013 | Bartlett | ................... | G01R 35/00 324/601 |
| 9,673,773 B2 * | 6/2017 | Liu | ...................... | H04L 25/0298 |

* cited by examiner

*Primary Examiner* — Kenneth B Wells
(74) *Attorney, Agent, or Firm* — JCIPRNET

(57) ABSTRACT

A voltage mode signal transceiving device and a voltage mode signal transmitter thereof are provided. The voltage mode signal transmitter includes a driver, an output resistor, and a compensation capacitor. The driver provides a transmitting signal to an output end, where the output end is coupled to a receiver. The output resistor is connected in series to a coupling path between the driver and the receiver. The compensation capacitor and the output resistor are coupled in parallel. A capacitance value of the compensation capacitor is essentially equal to a capacitance value of an equivalent capacitor on an input end of the receiver.

9 Claims, 5 Drawing Sheets

VOLTAGE MODE SIGNAL TRANSCEIVING DEVICE AND VOLTAGE MODE SIGNAL TRANSMITTER THEREOF

CROSS-REFERENCE TO RELATED APPLICATION

This application claims the priority benefit of Taiwan application serial no. 109104139, filed on Feb. 11, 2020. The entirety of the above-mentioned patent application is hereby incorporated by reference herein and made a part of this specification.

BACKGROUND

Technical Field

The disclosure relates to a voltage mode signal transceiving device and a voltage mode signal transmitter thereof, and in particular, to a voltage mode signal transceiving device and a voltage mode signal transmitter thereof featuring increased operating bandwidths.

Description of Related Art

When the operating bandwidth of a voltage mode signal transmitter increases, an inter-symbol-interference problem may occur in an output end, that is, a parasitic capacitor on a package body, of the voltage mode signal transmitter. The amount of jitter of the voltage mode signal transmitter is thereby increased, so that performance of the voltage mode signal transmitter is affected. In the conventional technical field, a pre/de-emphasis circuit is disposed most of the time to equalize a channel response of the voltage mode signal transmitter. In this manner, however, a complex circuit architecture is provided and the amplitude of an outputted transmitting signal is further lowered. Performance of the voltage mode signal transmitter is thereby affected.

SUMMARY

The disclosure provides a voltage mode signal transceiving device and a voltage mode signal transmitter thereof featuring increased operating bandwidths.

A voltage mode signal transmitter of the disclosure includes a driver, an output resistor, and a compensation capacitor. The driver provides a transmitting signal to an output end, where the output end is coupled to a receiver. The output resistor is connected in series to a coupling path between the driver and the receiver. The compensation capacitor and the output resistor are coupled in parallel.

In an embodiment of the disclosure, a capacitance value of the compensation capacitor is essentially equal to a capacitance value of an equivalent capacitor on the input end of the receiver.

In an embodiment of the disclosure, the equivalent capacitor on the input end of the receiver is a capacitor between the input end of the receiver and a reference ground end.

In an embodiment of the disclosure, the compensation capacitor is a variable capacitor.

In an embodiment of the disclosure, the voltage mode signal transmitter further includes a capacitance detector. The capacitance detector is coupled to the input end of the receiver and is configured to detect the capacitance value of the equivalent capacitor on the input end of the receiver and generate a control signal.

In an embodiment of the disclosure, the capacitance value of the compensation capacitor is adjusted according to the control signal.

In an embodiment of the disclosure, the driver includes a first transistor and a second transistor. The first transistor includes a first end for receiving a power supply voltage and a second end for providing a transmitting signal. A control end of the first transistor receives a first input signal.

A voltage mode signal transceiving device of the disclosure includes a receiver and the foregoing voltage mode signal transmitter. The receiver is coupled to the voltage mode signal transmitter.

Based on the foregoing, in the voltage mode signal transmitter of the disclosure, the compensation capacitor is disposed on the output end. By making the capacitance value of the compensation capacitor be essentially equal to the capacitance value of the equivalent capacitor on the input end of the receiver, the transmitting signal can be unrelated to the frequency of the transmitting signal. Further the operating bandwidth of the voltage mode signal transmitter can be increased.

In order to make the above features and advantages of the disclosure more comprehensible, embodiments are hereinafter described in detail with reference to the accompanying drawings.

DESCRIPTION OF THE EMBODIMENTS

Figure 1:
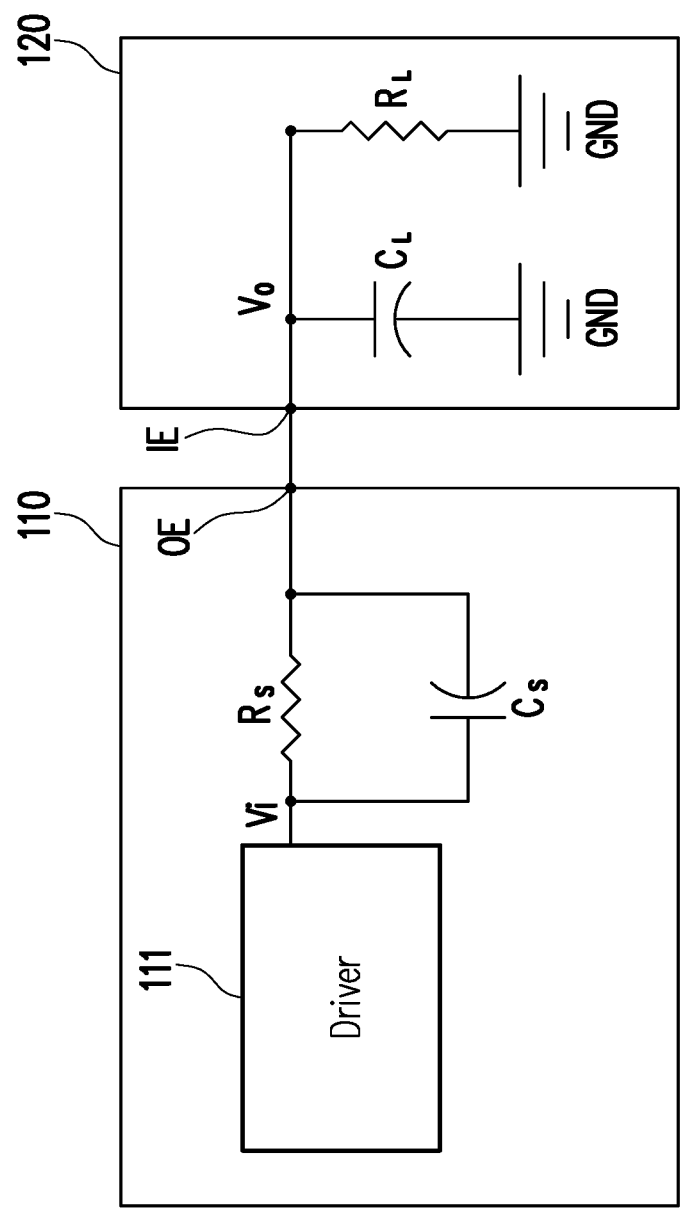
FIG. 1 is a schematic diagram illustrating a voltage mode signal transceiving device according to an embodiment of the disclosure.

With reference to FIG. 1, FIG. 1 is a schematic diagram illustrating a voltage mode signal transceiving device according to an embodiment of the disclosure. A voltage mode signal transceiving device 100 includes a voltage mode signal transmitter 110 and a receiver 120. The voltage mode signal transmitter 110 includes a driver 111. The driver 111 is configured to provide a transmitting signal $V_t$ to an output end OE of the voltage mode signal transmitter 110. The output end OE of the voltage mode signal transmitter 110 is coupled to the receiver 120. The voltage mode signal transmitter 110 includes an output resistor $R_S$ and a compensation capacitor $C_S$. The output resistor $R_S$ is connected in series to a coupling path between the driver 111 and the receiver 120. In the present embodiment, the output resistor $R_S$ is connected in series between the driver 111 and the output end OE of the voltage mode signal transmitter 110. The compensation capacitor $C_S$ and the output resistor $R_S$ are coupled in parallel.

In another aspect, the receiver 120 provides a load resistor $R_L$, and an equivalent capacitor $C_L$ is provided between an input end IE of the receiver 120 and a reference ground end GND. The input end IE of the receiver 120 receives an input signal $V_O$ generated according to the transmitting signal $V_i$.

It should be noted herein that, in the present embodiment, a capacitance value of the compensation capacitor $C_S$ may be set to be equal to a capacitance value of the equivalent capacitor $C_L$. Under such condition, a relationship between the input signal $V_O$ and the transmitting signal $V_i$ may be represented as a mathematical formula (1) shown as follows:

$$V_o = V_i \times \frac{Z_L}{Z_L + Z_S} \quad (1)$$

Herein, $Z_L$ is an equivalent impedance provided by the load resistor $R_L$ and the equivalent capacitor $C_L$ that are coupled in parallel with each other. $Z_S$ is an equivalent impedance provided by the output resistor $R_S$ and the compensation capacitor $C_S$ that are coupled in parallel with each other. Under a condition that the equivalent capacitor $C_L$ and the compensation capacitor $C_S$ have the same capacitance value, an amplitude of the input signal $V_O$ may be independent of a frequency of the input signal $V_O$.

Incidentally, in the embodiments of the disclosure, the compensation capacitor $C_S$ may be treated as a boost capacitor, and may perform, based on the transmitting signal $V_i$, voltage lifting on the input signal $V_O$ transmitted onto the input end IE of the receiver 120. Moreover, under the condition that the amplitude of the input signal $V_O$ may be independent of the frequency of the input signal $V_O$, an operating bandwidth of the voltage mode signal transceiving device 100 may be effectively increased.

In addition, in actual applications, because a certain degree of error exists in component design, it may be difficult to make the equivalent capacitor $C_L$ and the compensation capacitor $C_S$ have the same capacitance value. Therefore, in the embodiments of the disclosure, the operating bandwidth of the voltage mode signal transceiving device 100 may also be effectively increased by making the capacitance value of the equivalent capacitor $C_L$ be essentially equal to the capacitance value of the compensation capacitor $C_S$.

Figure 2:
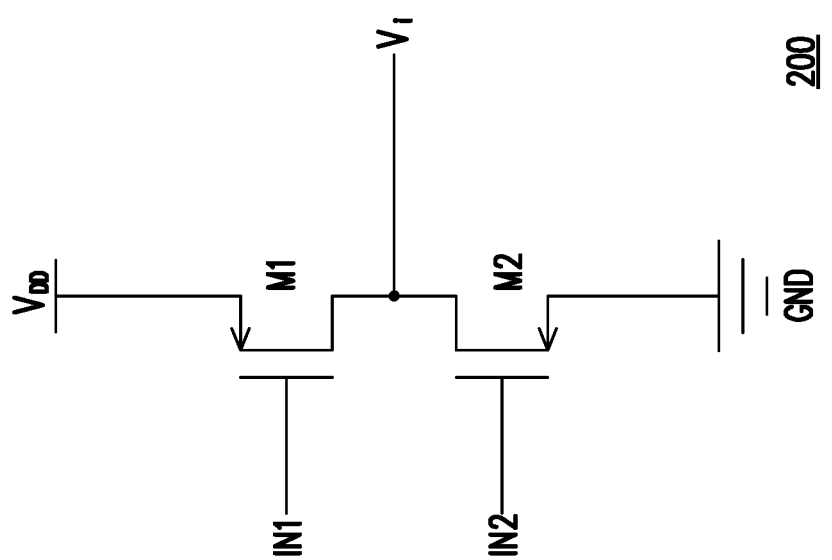
FIG. 2 is a schematic diagram illustrating implementation of a driver according to an embodiment of the disclosure.

With reference to FIG. 2, FIG. 2 is a schematic diagram illustrating implementation of a driver according to an embodiment of the disclosure. In FIG. 2, a driver 200 applied to a voltage mode signal transmitter of an embodiment of the disclosure includes transistors M1 and M2. A first end of the transistor M1 receives a power supply voltage $V_{DD}$, a second end of the transistor M1 provides a transmitting signal $V_i$, and a control end of the transistor M1 receives an input signal IN1. A first end of the transistor M2 is coupled to the second end of the transistor M1, a second end of the transistor M2 is coupled to the reference ground end GND, and a control end of the transistor M2 receives an input signal IN2.

In the present implementation, conductivity forms of the transistors M1 and M2 may be complementary. The input signal IN1 and the input signal IN2 may be the same signal.

In addition, a driving circuit well known to people having ordinary skill in the art may also be applied to the driver of the embodiments of the disclosure and is not limited to the implementation of FIG. 2. The implementation of FIG. 2 is only for illustrative purposes and is not intended to limit the scope of the disclosure.

Figure 3A:
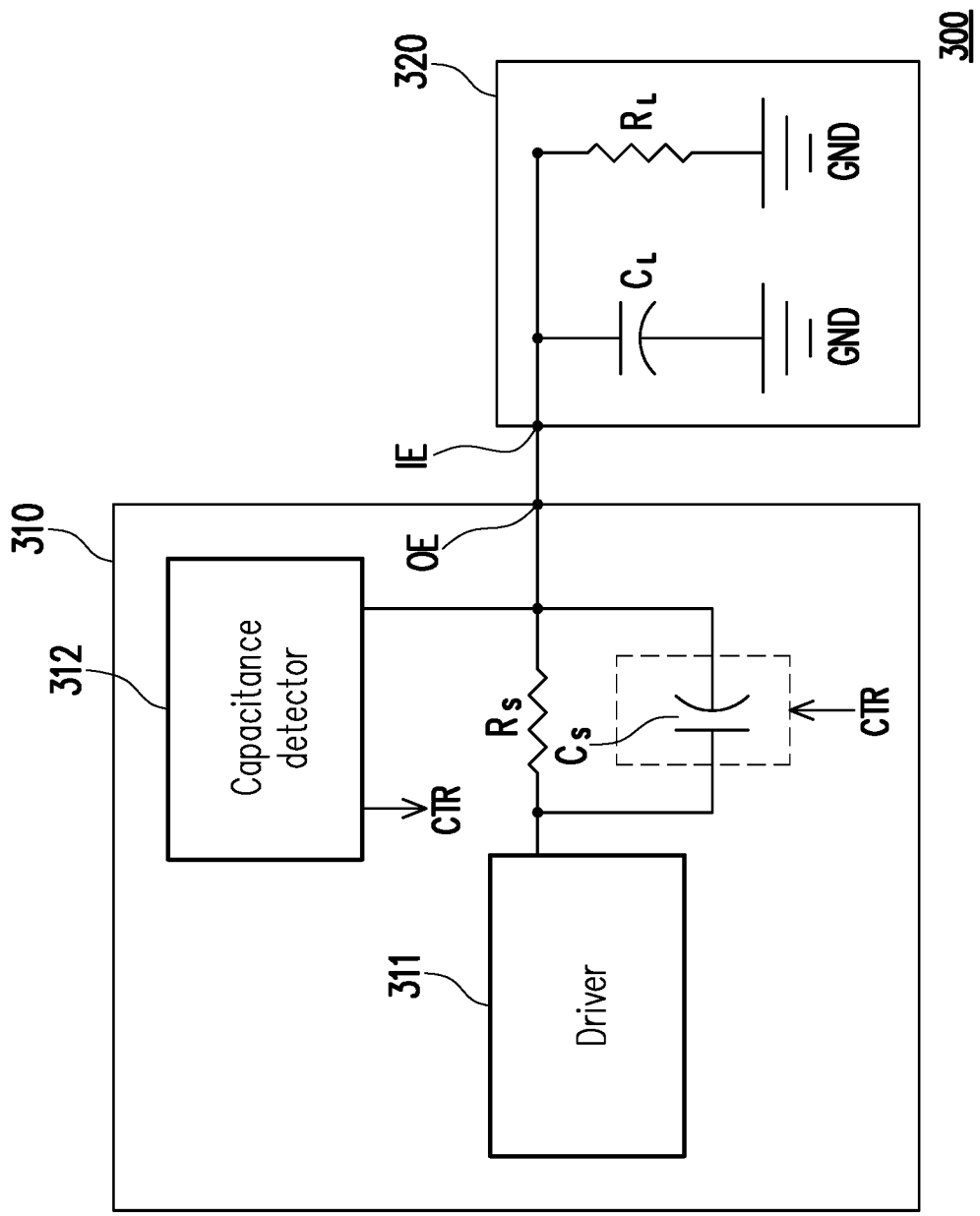
FIG. 3A is a schematic diagram illustrating a voltage mode signal transceiving device according to another embodiment of the disclosure.

With reference to FIG. 3, FIG. 3A is a schematic diagram illustrating a voltage mode signal transceiving device according to another embodiment of the disclosure. A voltage mode signal transceiving device 300 includes a voltage mode signal transmitter 310 and a receiver 320. The voltage mode signal transmitter 310 includes a driver 311, a capacitance detector 312, an output resistor $R_S$, and a compensation capacitor $C_S$. In the present embodiment, the compensation capacitor $C_S$ may be a variable capacitor. Further, a capacitance value of the compensation capacitor $C_S$ may be adjusted according to a control signal CTR.

The receiver 320 has a load resistor $R_L$ and an equivalent capacitor $C_L$. The control signal CTR may be generated according to a capacitance value of the equivalent capacitor $C_L$. In the embodiments of the disclosure, the capacitance detector 312 is configured to detect the capacitance value of the equivalent capacitor $C_L$. The control signal CTR is generated according the detected capacitance value of the equivalent capacitor $C_L$. The capacitance value of the compensation capacitor $C_S$ may be adjusted to be essentially the same as the capacitance value of the equivalent capacitor $C_L$ by receiving the control signal CTR generated by the capacitance detector 312, so that an operating bandwidth of the voltage mode signal transceiving device 300 is increased.

In another embodiment of the disclosure, the capacitance detector 312 is not required to be disposed in the voltage mode signal transmitter 310. Herein, under a condition that the capacitance value of the equivalent capacitor $C_L$ is known, the control signal CTR may be externally written to be generated, and the capacitance value of the compensation capacitor $C_S$ may be adjusted to be essentially identical to the capacitance value of the equivalent capacitor $C_L$ through the control signal CTR. The above-mentioned external writing manner may be completed by performing a command and data writing action by one or more input pins of the voltage mode signal transmitter 310 or may be completed by arranging a non-volatile memory element in the voltage mode signal transmitter 310 and performing a writing action on the non-volatile memory element, and the manner is not specifically limited.

A hardware architecture of the compensation capacitor $C_S$ being a variable capacitor may be implemented by using any variable capacitor known to people having ordinary skill in the art of which the capacitance value may be adjusted through an electrical signal, which is not specifically limited.

Incidentally, in actual applications, when a type of the receiver 320 corresponding to the voltage mode signal transmitter 310 is known, capacitance values of equivalent capacitors $C_L$ of a plurality of types of receivers 320 may be classified. Further, the control signal CTR may be generated according to the type of the currently-used receiver 320. In detail, if the capacitance values of the equivalent capacitors $C_L$ of the receivers 320 may be classified into four types according to numerical values, the control signals CTR respectively corresponding to the four types of receivers 320 may be set to two-bit logic signals 00, 01, 10, and 11. When the capacitance value of the equivalent capacitor $C_L$ of the receiver 320 coupled to the voltage mode signal transmitter 310 is the second type, the control signal CTR in the voltage mode signal transmitter 310 may be set to 01. In this way, the capacitance value of the compensation capacitor $C_S$ may be set rapidly and effectively.

Figure 3B:
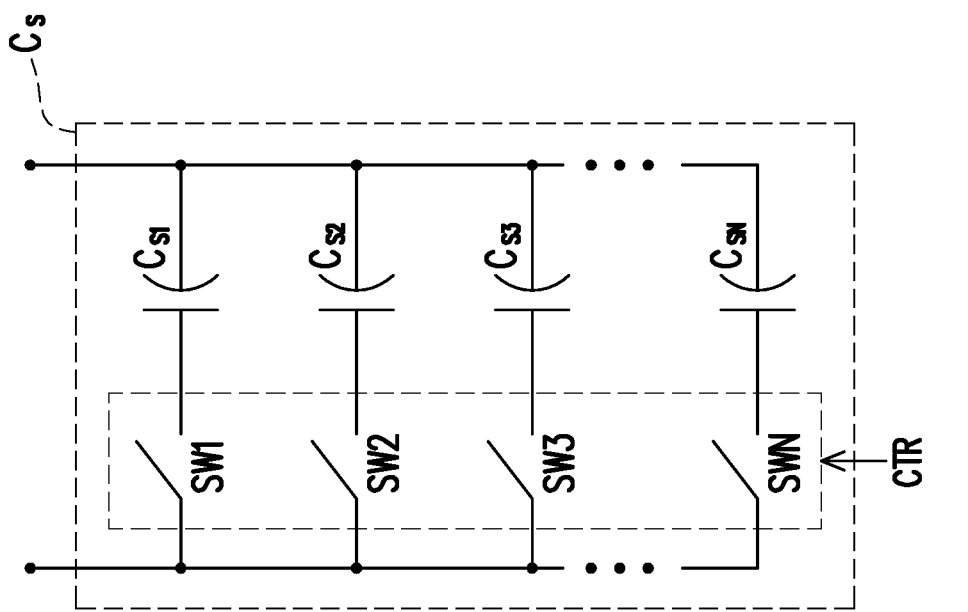
FIG. 3B is a schematic diagram illustrating implementation of a compensation capacitor according to an embodiment of the disclosure.

An implementation example of the compensation capacitor $C_S$ may be found with reference to FIG. 3B. FIG. 3B is a schematic diagram illustrating implementation of a compensation capacitor according to an embodiment of the disclosure. In FIG. 3B, the compensation capacitor $C_S$ is formed by a plurality of capacitors $C_{S1}$ to $C_{SN}$ and a plurality of switches SW1 to SWN. The capacitors $C_{S1}$ to $C_{SN}$ are respectively connected in series to the switches SW1 to SWN to form a plurality of capacitor switch strings. The capacitor switch strings are coupled in parallel with each other. In the present implementation, the switches SW1 to SWN are controlled by the control signal CTR to be switched on or switched off respectively. The control signal CTR may have N bits and controls on and off states of the switches SW1 to SWN respectively. Adjustment of the capacitance value of the compensation capacitor $C_S$ may be completed by switching on different numbers of the switches SW1 to SWN.

In the present implementation, the capacitance values of the capacitors $C_{S1}$ to $C_{SN}$ may be identical or may have a predetermined proportional relationship. For example, the ratio of the capacitance values of the capacitors $C_{S1}$ to $C_{SN}$ may be $1:2^1:2^2:\ldots:2^{N-1}$. In this way, taking the capacitance value of the capacitor $C_{S1}$ being UC for example, the capacitance value of the compensation capacitor $C_S$ may be equal to UC×M by switching on one or more of the switches SW1 to SWN, where M may be an integer between 1 and $2^N$.

Figure 4:
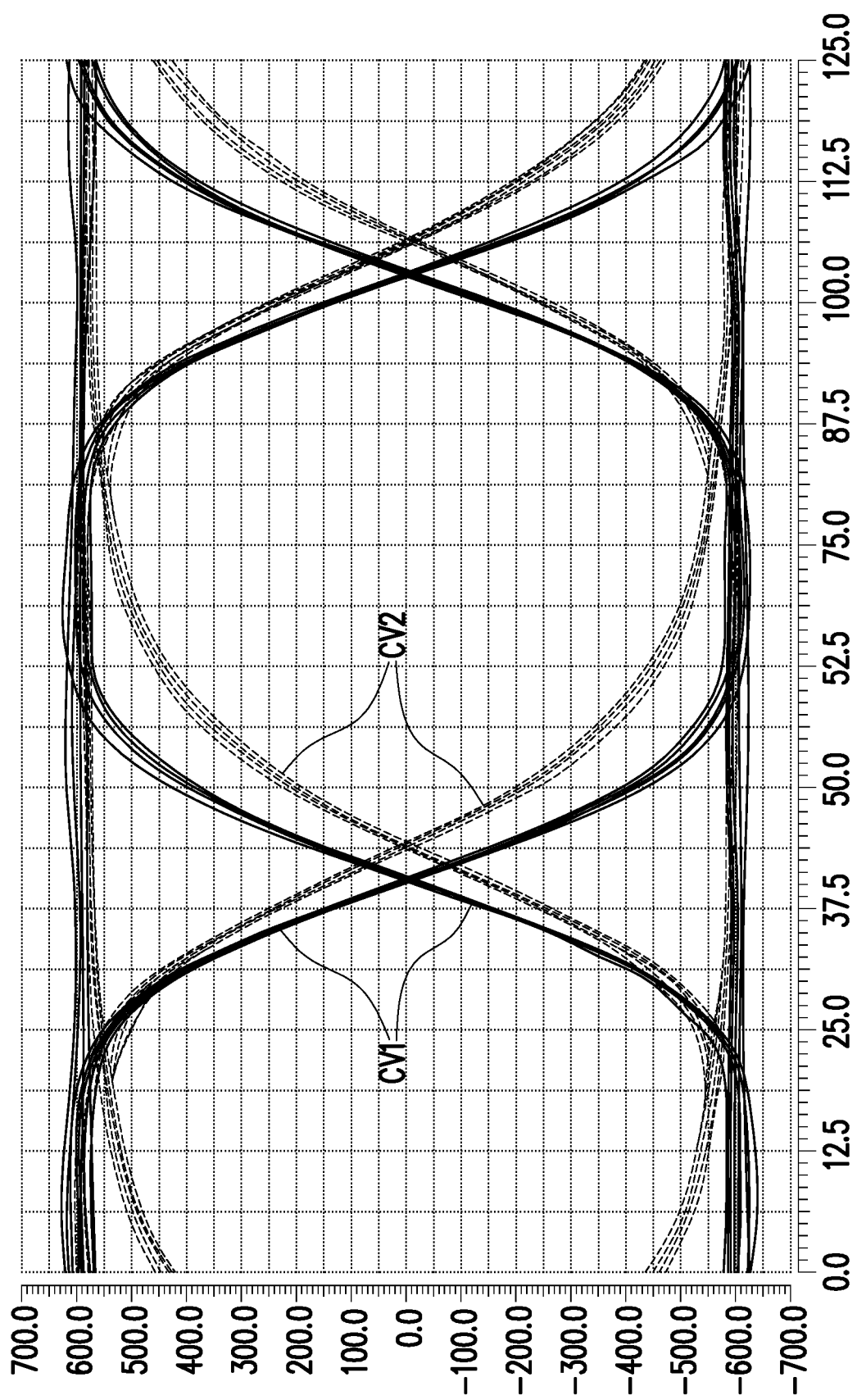
FIG. 4 is a waveform graph illustrating an input signal received by a receiver according to an embodiment of the disclosure.

With reference to FIG. 4, FIG. 4 is a waveform graph illustrating an input signal received by a receiver according to an embodiment of the disclosure. Herein, a waveform CV1 is a waveform of an input signal after a compensation capacitor is added, and a waveform CV2 is a waveform of the input signal after the compensation capacitor is removed. Herein, it may be clearly seen that, when the compensation capacitor is disposed in the voltage mode signal transmitter, an eye width in an eye diagram formed by the input signal may be increased effectively, indicating that an operating bandwidth of the voltage mode signal transceiving device is increased effectively.

In conclusion, in the disclosure, a compensation capacitor is connected in parallel to the output resistor in the voltage mode signal transmitter, and the capacitance value of the compensation capacitor is set to be essentially equal to the capacitance value of the equivalent capacitor of the receiver. In this way, the amplitude of the input signal received by the receiver and the frequency of the input signal may be independent of each other (not related), so that the operating bandwidth of the voltage mode signal transceiving device is effectively increased. Performance of the voltage mode signal transceiving device may therefore be improved when circuit costs and design difficulty are both required to be taken into account.

Although the disclosure has been disclosed as above with the embodiments, the embodiments are not intended to limit the disclosure. Any person with ordinary knowledge in the technical field can make some changes and modifications without departing from the spirit and scope of the disclosure. Therefore, the scope of protection of the disclosure shall be subject to the attached claims.

What is claimed is:

1. A voltage mode signal transmitter, coupled to an input end of a receiver, the voltage mode signal transmitter comprising:
    a driver, providing a transmitting signal to an output end, wherein the output end is coupled to the receiver;
    an output resistor, connected in series to a coupling path between the driver and the receiver;
    a compensation capacitor, coupled in parallel to the output resistor; and
    a capacitance detector, coupled to the input end of the receiver and configured to detect a capacitance value of an equivalent capacitor on the input end of the receiver and generate a control signal to adjust the capacitance value of the compensation capacitor.

2. The voltage mode signal transmitter according to claim 1, wherein a capacitance value of the compensation capacitor is essentially equal to the capacitance value of the equivalent capacitor on the input end of the receiver.

3. The voltage mode signal transmitter according to claim 1, wherein the equivalent capacitor on the input end of the receiver is a capacitor between the input end of the receiver and a reference ground end.

4. The voltage mode signal transmitter according to claim 1, wherein the compensation capacitor is a variable capacitor.

5. The voltage mode signal transmitter according to claim 1, wherein the driver comprises:
    a first transistor, comprising a first end for receiving a power supply voltage and a second end for providing the transmitting signal, wherein a control end of the first transistor receives a first input signal; and
    a second transistor, comprising a first end coupled to the second end of the first transistor, wherein a second end of the second transistor is coupled to a reference ground end, and a control end of the second transistor receives a second input signal.

6. A voltage mode signal transceiving device, comprising:
    a receiver; and
    a voltage mode signal transmitter, coupled to an input end of the receiver, wherein the voltage mode signal transmitter comprises:
        a driver, providing a transmitting signal to an output end, wherein the output end is coupled to the receiver;
        an output resistor, connected in series to a coupling path between the driver and the receiver; and
        a compensation capacitor, coupled in parallel to the output resistor,
    wherein the voltage mode signal transmitter further comprises a capacitance detector, and the capacitance detector is coupled to the input end of the receiver and is configured to detect a capacitance value of an equivalent capacitor on the input end of the receiver and generate a control signal.

7. The voltage mode signal transceiving device according to claim 6, wherein a capacitance value of the compensation capacitor is essentially equal to the capacitance value of the equivalent capacitor on the input end of the receiver.

8. The voltage mode signal transceiving device according to claim 6, wherein the input end of the receiver provides the equivalent capacitor and an equivalent resistor,
    wherein the equivalent capacitor and the equivalent resistor are coupled in parallel between the input end of the receiver and a reference ground end.

9. The voltage mode signal transceiving device according to claim 6, wherein the compensation capacitor is a variable capacitor.

\* \* \* \* \*